(12) United States Patent
Ghodsi

(10) Patent No.: US 6,525,965 B2
(45) Date of Patent: Feb. 25, 2003

(54) ONE-SIDED FLOATING-GATE MEMORY CELL

(75) Inventor: Ramin Ghodsi, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/192,601

(22) Filed: Jul. 10, 2002

(65) Prior Publication Data

US 2002/0181283 A1 Dec. 5, 2002

Related U.S. Application Data

(62) Division of application No. 09/811,744, filed on Mar. 19, 2001, now Pat. No. 6,441,428.

(51) Int. Cl.[7] .............................................. G11C 16/04
(52) U.S. Cl. ........................... 365/185.18; 365/185.24; 365/185.01; 365/185.14
(58) Field of Search ....................... 365/185.18, 185.03, 365/185.14, 185.24

(56) References Cited

U.S. PATENT DOCUMENTS

| | | | |
|---|---|---|---|
| 4,939,558 A | | 7/1990 | Smayling et al. |
| 5,491,657 A | | 2/1996 | Haddad et al. |
| 5,739,569 A | | 4/1998 | Chen |
| 5,751,634 A | * | 5/1998 | Itoh ..................... 365/185.17 |
| 5,757,697 A | | 5/1998 | Briner |
| 5,814,853 A | | 9/1998 | Chen |
| 5,912,844 A | * | 6/1999 | Chen et al. ............ 365/185.28 |
| 6,272,047 B1 | | 8/2001 | Mihnea et al. |
| 6,285,584 B1 | | 9/2001 | Ahrens et al. |
| 6,330,187 B1 | | 12/2001 | Choi et al. |

OTHER PUBLICATIONS

"Novel Electron Injection Method Using Band–to–Band Tunneling Induced Hot Electron (BBHE) for Flash Memory with a P–Channel Cell", T. Ohnakado et al;0–7803–2700–4 1995 IEEE (4 pgs).

"Band–To–Band Tunneling Induced Substrate Hot–Electron (BBISHE) Injection: A New Programming Mechanism for Nonvolatile Memory Devices", Chen et al, International Electron Devices Meeting, IEDM 1989, 6 pgs.).

* cited by examiner

Primary Examiner—David Nelms
Assistant Examiner—Connie C. Yoha
(74) Attorney, Agent, or Firm—Leffert Jay & Polglaze P.A.; Thomas W. Leffert

(57) ABSTRACT

Floating-gate memory cells having a control gate for coupling to a word line, a floating gate, a first source/drain region for coupling to a bit line, and a floating second source/drain region are adapted for use in flash memory devices. Such floating-gate memory cells eliminate the need to provide electrical contact to the second source/drain region, thus simplifying the fabrication process and array architecture. The floating-gate memory cells may be programmed using band-to-band tunneling. The floating-gate memory cells may be read using capacitance sensing or forward current sensing techniques.

39 Claims, 6 Drawing Sheets

ONE-SIDED FLOATING-GATE MEMORY CELL

RELATED APPLICATION

This is a divisional application of U.S. patent application Ser. No. 09/811,744 (allowed) filed Mar. 19, 2001 now U.S. Pat. No. 6,441,428, titled "ONE-SIDED FLOATING-GATE MEMORY CELL" and commonly assigned, the entire contents of which are incorporated herein by reference.

TECHNICAL FIELD OF THE INVENTION

The present invention relates generally to semiconductor memory devices, and in particular, the present invention relates to floating-gate memory cells and their operation.

BACKGROUND OF THE INVENTION

Electronic information handling or computer systems, whether large machines, microcomputers or small and simple digital processing devices, require memory for storing data and program instructions. Various memory systems have been developed over the years to address the evolving needs of information handling systems. One such memory system includes semiconductor memory devices.

Semiconductor memory devices are rapidly-accessible memory devices. In a semiconductor memory device, the time required for storing and retrieving information generally is independent of the physical location of the information within the memory device. Semiconductor memory devices typically store information in a large array of cells. A group of cells are electrically connected together by a bit line, or data line. An electrical signal is used to program a cell or cells. The electrical signal on the bit line is controlled by a driver circuit. Accordingly, a semiconductor memory device may include several groups of cells, each coupled together with a bit line operated by a driver circuit.

Computer, communication and industrial applications are driving the demand for memory devices in a variety of electronic systems. One important form of semiconductor memory device includes a non-volatile memory made up of floating-gate memory cells called flash memory. Flash memory is often used where regular access to the data stored in the memory device is desired, but where such data is seldom changed. Computer applications use flash memory to store BIOS firmware. Peripheral devices such as printers store fonts and forms on flash memory. Digital cellular and wireless applications consume large quantities of flash memory and are continually pushing for lower voltages and higher densities. Portable applications such as digital cameras, audio recorders, personal digital assistants (PDAs) and test equipment use flash memory cards as a storage medium.

Conventional flash memory cells make use of a floating-gate transistor including a source, a drain, a floating gate and a control gate. In such devices, access operations are carried out by applying biases to each of these terminals. The floating-gate transistors generally include n-channel floating-gate field-effect transistors, but may also include p-channel floating-gate field-effect transistors.

Write operations are often carried out by channel hot-carrier injection. This process induces a flow of electrons between the source and the drain, and accelerates them toward the floating gate in response to a positive bias applied to the control gate. This is termed hot-carrier injection because the electrons possess sufficient kinetic energy to cross the channel-gate oxide barrier and enter the oxide conduction band. Fowler-Nordheim tunneling can also be used to program the memory cell, such as by applying a positive bias to the control gate, grounding one source/drain region and floating the other source/drain region. The positive bias applied to the control gate causes the electrons to be transferred from the grounded source/drain region to the floating gate. Fowler-Nordheim tunneling is an example of cold-carrier injection as the electrons do not possess kinetic energy in excess of the channel-gate oxide barrier. Instead, the electrons are able to surmount this barrier due to the wave nature of the electron.

Read operations generally include sensing a current between the source and the drain, i.e., the MOSFET current, in response to a bias applied to the control gate. Erase operations are generally carried out through Fowler-Nordheim tunneling. This erase process may include electrically floating one source/drain region, grounding or applying a positive bias to the other source/drain region, and applying a negative voltage to the control gate.

Designers are under constant pressure to reduce manufacturing complexity, and thus cost. It has been proposed that using band-to-band tunneling current as a read sensing current, a floating-gate diode can function as a non-volatile memory cell. See, U.S. Pat. No. 5,814,853 titled "Sourceless Floating Gate Memory Device and Method of Storing Data" and issued Sep. 29, 1998 to Chen. This floating-gate diode is described in Chen as a non-volatile memory cell having only one p-n junction per cell. Such a device is similar to a floating-gate transistor used in a typical flash memory cell except that the source has been eliminated. Chen, however, describes a read operation utilizing a read gate voltage of −7V to produce current differences between a programmed and an un-programmed device sufficient to serve as a basis for memory operation. While typical flash memory devices include circuitry for producing such pumped negative voltages for use in the relatively infrequent operations of writing and erasing a cell, it is generally undesirable to require such pumped negative voltages for use in the relatively frequent operation of reading a cell.

For the reasons stated above, and for other reasons stated below which will become apparent to those skilled in the art upon reading and understanding the present specification, there is a need in the art for alternate non-volatile memory cells, apparatus making use of such memory cells, and methods of their operation.

SUMMARY OF THE INVENTION

The above-mentioned problems with memory devices and other problems are addressed by the present invention and will be understood by reading and studying the following specification.

Floating-gate memory cells are described herein having a control gate for coupling to a word line, a floating gate, a first source/drain region for coupling to a bit line, and a floating second source/drain region. Such floating-gate memory cells eliminate the need to provide electrical contact to the second source/drain region, thus simplifying the fabrication process and the array architecture. Such memory cells further eliminate the need for a common array source found in conventional floating-gate memory arrays.

Methods of reading such floating-gate memory cells are also provided. The methods described herein facilitate more aggressive scaling of the memory cells and array as the techniques are less sensitive to MOSFET short channel effects than some conventional sensing techniques. Methods described herein include capacitance and forward current sensing techniques.

For one embodiment, the invention includes a floating-gate memory cell. The memory cell includes a gate dielectric layer overlying a substrate having a first conductivity type, a floating gate layer overlying the gate dielectric layer, an intergate dielectric layer overlying the floating gate layer, and a control gate layer overlying the intergate dielectric layer for coupling to a word line. The memory cell further includes a first source/drain region formed in the substrate for coupling to a bit line and having a second conductivity type different than the first conductivity type. The memory cell further includes a second source/drain region formed in the substrate and having the second conductivity type. The second source/drain region is permanently electrically floating.

For another embodiment, the invention includes a floating-gate memory cell. The memory cell includes a gate dielectric layer overlying a substrate having a first conductivity type, a floating gate layer overlying the gate dielectric layer, an intergate dielectric layer overlying the floating gate layer, and a control gate layer overlying the intergate dielectric layer for coupling to a word line. The memory cell further includes a first source/drain region formed in the substrate for coupling to a bit line and having a second conductivity type different than the first conductivity type. The memory cell further includes a second source/drain region formed in the substrate and having the second conductivity type. No contact is formed to the second source/drain region.

For yet another embodiment, the invention includes a floating-gate memory cell. The memory cell includes a gate dielectric layer overlying a substrate having a first conductivity type, a floating gate layer overlying the gate dielectric layer, an intergate dielectric layer overlying the floating gate layer, and a control gate layer overlying the intergate dielectric layer for coupling to a word line. The memory cell further includes a first source/drain region formed in the substrate for coupling to a bit line and a doped region formed in the substrate below and coupled to the first source/drain region. The first source/drain region and the doped region have a second conductivity type different than the first conductivity type and the doped region is offset from a channel region of the memory cell. The memory cell further includes an electrically floating second source/drain region formed in the substrate and having the second conductivity type. For a further embodiment, the doped region utilizes a dopant species different from the first source/drain region to improve the grading of the p-n junction.

For a further embodiment, the invention provides a method of reading a floating-gate memory cell. The method includes applying a bias to a control gate of the floating-gate memory cell and detecting a charge loss on a bit line coupled to a first source/drain region of the memory cell while a second source/drain region of the memory cell is electrically floating. The bias applied to the control gate is greater than a threshold voltage of the memory cell in a first programmed state and less than a threshold voltage of the memory cell in a second programmed state. Furthermore, the charge loss on the bit line is indicative of the programmed state of the memory cell.

For a still further embodiment, the invention provides a method of reading a floating-gate memory cell formed in a substrate. The method includes applying a bias to a control gate of the floating-gate memory cell, applying a forward bias to a bit line coupled to a first source/drain region of the memory cell while a second source/drain region of the memory cell is electrically floating, and detecting a forward current from the memory cell to the substrate. The bias applied to the control gate is greater than a threshold voltage of the memory cell in a first programmed state and less than a threshold voltage of the memory cell in a second programmed state. Furthermore, the level of the forward current is indicative of the programmed state of the memory cell.

The invention further provides methods and apparatus of varying scope.

DETAILED DESCRIPTION OF THE INVENTION

In the following detailed description of the present embodiments, reference is made to the accompanying drawings that form a part hereof, and in which is shown by way of illustration specific embodiments in which the invention may be practiced. These embodiments are described in sufficient detail to enable those skilled in the art to practice the invention, and it is to be understood that other embodiments may be utilized and that process, electrical or mechanical changes may be made without departing from the scope of the present invention. The terms wafer or substrate used in the following description include any base semiconductor structure. Examples include silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a wafer or substrate in the following description, previous process steps may have been utilized to form regions/junctions in the base semiconductor structure, and the terms wafer and substrate include the underlying layers containing such regions/junctions. The following detailed description is, therefore, not to be taken in a limiting sense, and the scope of the present invention is defined only by the appended claims and equivalents thereof.

Figure 1:
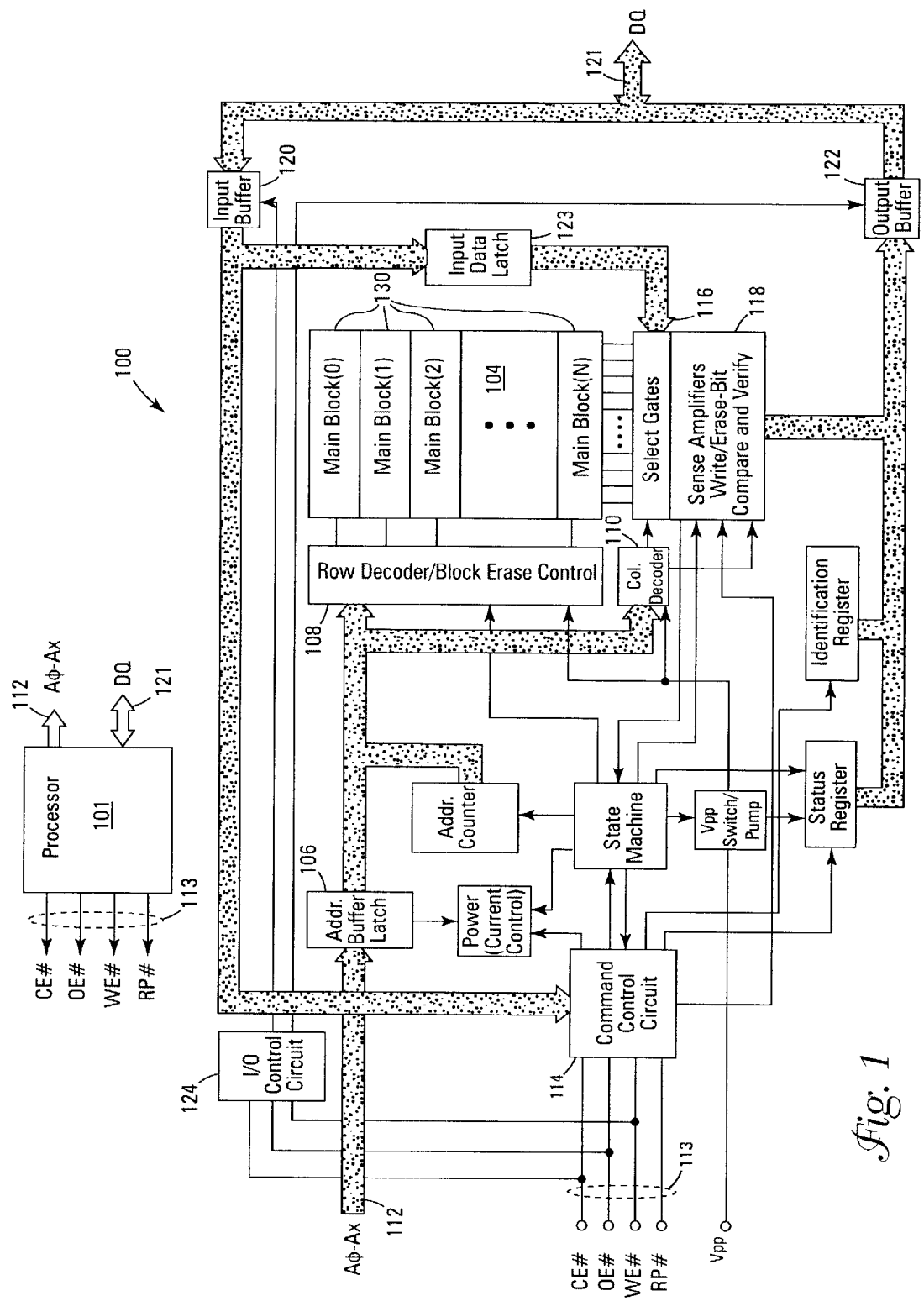
FIG. 1 is a block diagram of a basic flash memory device coupled to a processor in accordance with an embodiment of the invention.

FIG. 1 illustrates a block diagram of a non-volatile or flash memory device 100 in accordance with one embodiment of the invention. The memory device 100 is coupled to a processor 101 to form part of an electronic system. The memory device 100 has been simplified to focus on features of the memory that are helpful in understanding the present invention. The memory device 100 includes an array of non-volatile memory cells 104. The memory cells (not shown in FIG. 1) are floating-gate memory cells in accordance with the embodiments of the invention. The array is arranged in rows and columns, with the rows arranged in blocks, such as main blocks 130. The structure of main blocks 130 allow memory cells to be erased in blocks. Data, however, may be stored in the memory array separate from the block structure.

A row decoder 108 and a column decoder 110 are provided to decode address signals provided on address lines A0–Ax 112. An address buffer circuit 106 is provided to latch the address signals. Address signals are received and decoded to access the memory array 104. A select circuit 116 is provided to select a column of the array identified with the column decoder 110. Sense amplifier and compare circuitry 118 is used to sense data stored in the memory cells and verify the accuracy of stored data. Data input 120 and output 122 buffer circuits are included for bi-directional data communication over a plurality of data (DQ) lines 121 with the processor 101. A data latch 123 is typically provided between input buffer 120 and the memory array 104 for storing data values (to be written to a memory cell) received from the DQ lines 121.

Command control circuit 114 decodes signals provided on control lines 113 from the processor 101. These signals are used to control the operations on the memory array 104, including data read, data write, and erase operations. Input/output control circuit 124 is used to control the input buffer 120 and the output buffer 122 in response to some of the control signals. As stated above, the memory device 100 has been simplified to facilitate a basic understanding of the features of the memory. A more detailed understanding of typical flash memories is known to those skilled in the art.

Figure 2:
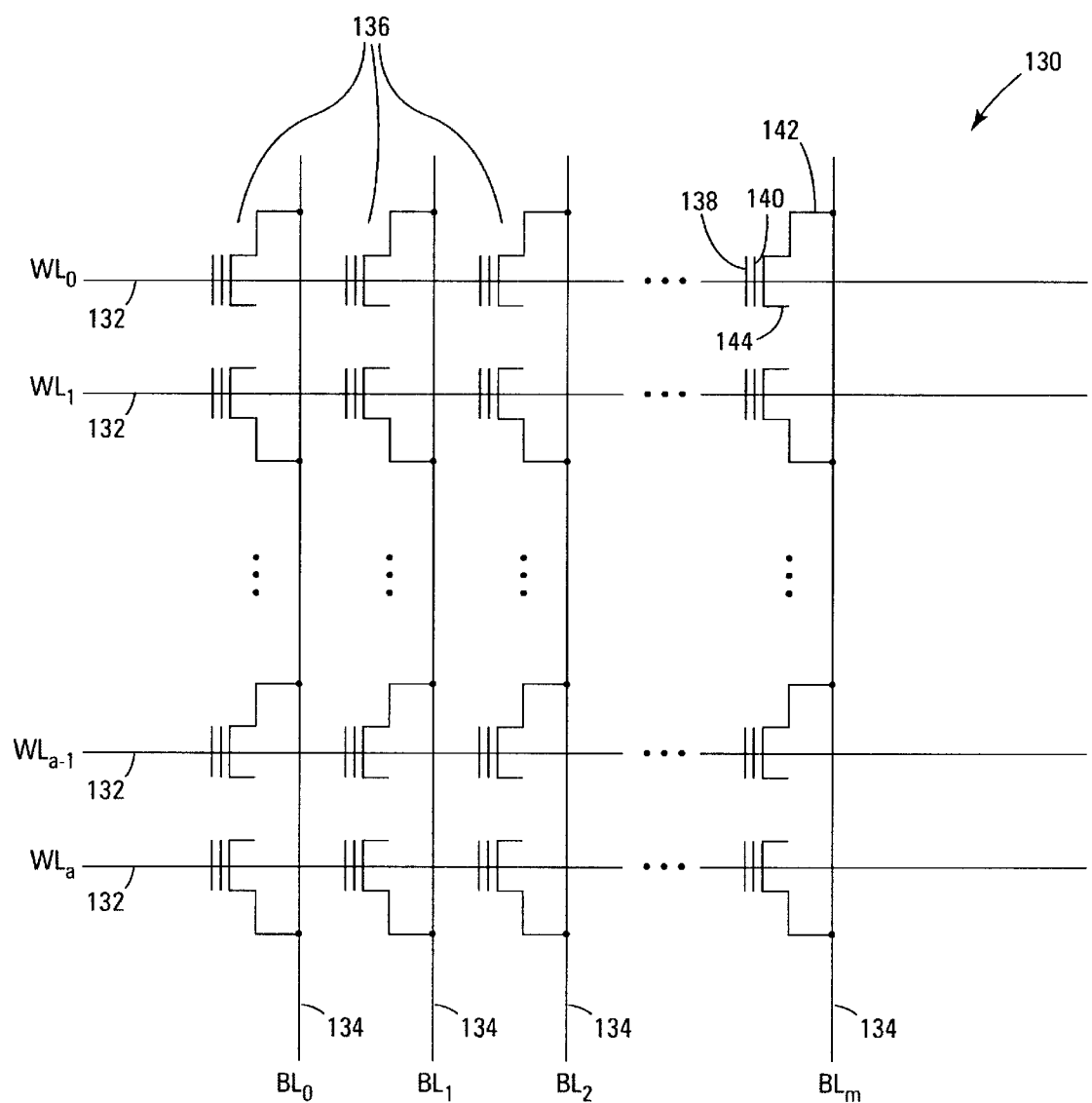
FIG. 2 is a schematic of a portion of a non-volatile memory main block as a portion of a memory array in accordance with an embodiment of the invention.

Arrays of non-volatile memory cells are often arranged in rows and columns of memory cells coupled to word lines and bit lines, respectively. The word lines are coupled to the control gates of the floating-gate memory cells. The bit lines are coupled to the drains of the floating-gate memory cells. FIG. 2 is a schematic of a portion of a non-volatile memory main block 130 as a portion of a memory array and containing floating-gate memory cells in accordance with one embodiment of the invention. The detail of main block 130 is provided to better understand the various embodiments of the invention. However, the invention is not limited to the specific array layout described with reference to FIG. 2.

As shown in FIG. 2, the main block 130 includes word lines 132 and intersecting bit lines 134. For ease of addressing in the digital environment, the number of word lines 132 and the number of bit lines 134 are each generally some power of two, e.g., 256 word lines 132 by 4,096 bit lines 134. Floating-gate memory cells 136 are located at each intersection of a word line 132 and a bit line 134. The floating-gate memory cells 136 represent the non-volatile memory cells for storage of data. Each floating-gate memory cell 136 includes a control gate 138 coupled to a word line 132, a floating gate 140, and a first source/drain region 142 coupled to a bit line. A column of the floating-gate memory cells 136 are those cells having their first source/drain regions 142 commonly coupled to a given bit line 134. A row of the floating-gate memory cells 136 are those cells having their control gates 138 commonly coupled to a given word line 132.

The floating-gate memory cells 136 further include a second source/drain region 144. The second source/drain regions 144 are electrically floating. While a second source/drain region 144 may be coupled to other second source/drain regions 144, for one embodiment, there is no contact provided to the second source/drain regions 144. For a further embodiment, each second source/drain region 144 is permanently electrically floating, i.e., no circuitry is provided to facilitate applying a bias to the second source/drain region 144 other than through the creation of an inversion layer in the channel region between the first source/drain region 142 and the second source/drain region 144.

FIGS. 3A–3D are cross-sectional views of a floating-gate memory cell at various stages of fabrication in accordance with one embodiment of the invention. Looking first at FIG. 3A, a gate dielectric layer 210 is formed overlying a substrate 200, such as a wafer of monocrystalline silicon having a [100] orientation. The substrate 200 is doped to a first conductivity type, such as a p-type conductivity. As an example, the substrate 200 may be implanted with a p-type dopant, such as boron, followed by an anneal to produce a p-type substrate.

The surface of the substrate 200 is conditioned to set the $V_t$ of the future floating-gate memory cells. Such conditioning generally involves increasing the dopant level near the surface of the substrate 200 and may occur before or after formation of the gate dielectric layer 210. As an example, the p-type substrate 200 may be subjected to a p-type implant, such as a boron implant, to increase the dopant level near the surface. While not required, increasing the dopant level in what will become a channel region of a future floating-gate memory cell will serve to increase the inversion-layer-to-substrate capacitance.

The gate dielectric layer 210 contains a dielectric material. For one embodiment, the gate dielectric layer 210 is an oxide. The oxide may be formed by thermal or other oxidation technique. Other dielectric materials may be used for the gate dielectric layer 210. Specific examples include silicon oxides, silicon nitrides and silicon oxynitrides.

A floating gate layer 215 is formed overlying the gate dielectric layer 210. The floating gate layer 215 is the layer that will store the charge indicative of a programmed state of the future floating-gate memory cell. For one embodiment, the floating gate layer 215 is a conductively-doped polysilicon layer. For a further embodiment, the polysilicon layer has an n-type conductivity. The polysilicon layer may be formed by such techniques as CVD and may be conductively doped during or following formation.

An intergate dielectric layer 220 is formed overlying the floating gate layer 215. The intergate dielectric layer 220 contains a dielectric material. Some examples include silicon oxides, silicon nitrides or silicon oxynitrides. Further examples include dielectric metal oxides such as barium strontium titanate (BST), lead zirconium titanate (PZT) and lead lanthanum titanate (PLZT). Dielectric layers may further contain multiple layers of dielectric materials. One common example is an ONO (oxide-nitride-oxide) dielectric layer.

A control gate layer 225 is formed overlying the intergate dielectric layer 220. The control gate layer 225 contains a conductive material. For one embodiment, the conductive material is a conductively-doped polysilicon material. For another embodiment, the control gate layer 225 contains a metal layer overlying a metal silicide layer.

Figure 3A:
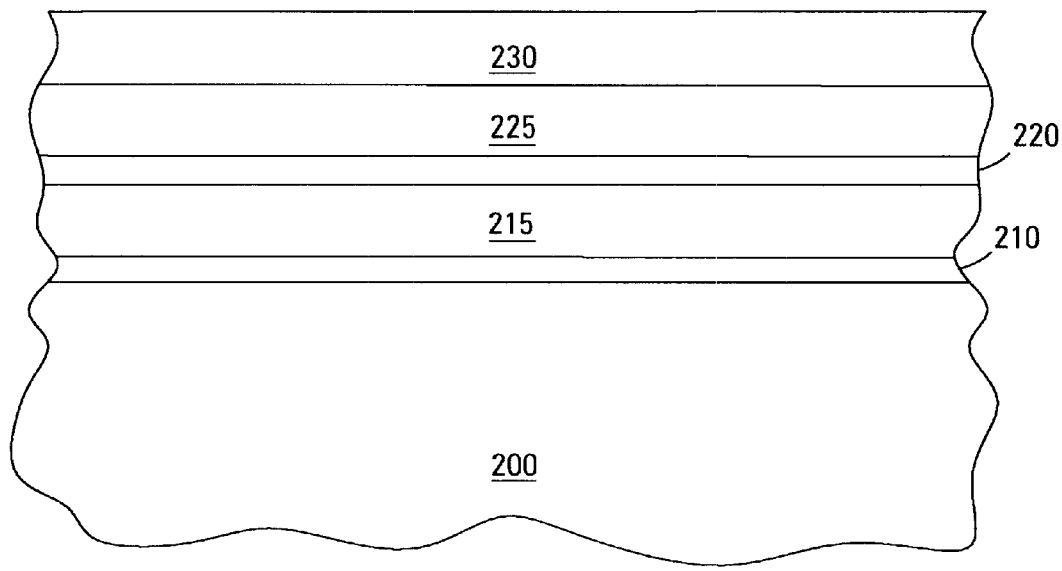
FIGS. 3A–3D are cross-sectional views of a floating-gate memory cell at various stages of fabrication in accordance with one embodiment of the invention.

A cap layer 230 is generally formed overlying the control gate layer 225 to act as an insulator and barrier layer. The cap layer 230 contains an insulator and may include such insulators as silicon oxide, silicon nitride, and silicon oxynitrides. For one embodiment, the cap layer 230 is silicon nitride, formed by such methods as CVD. The resulting structure is generally as depicted in FIG. 3A.

Figure 3B:
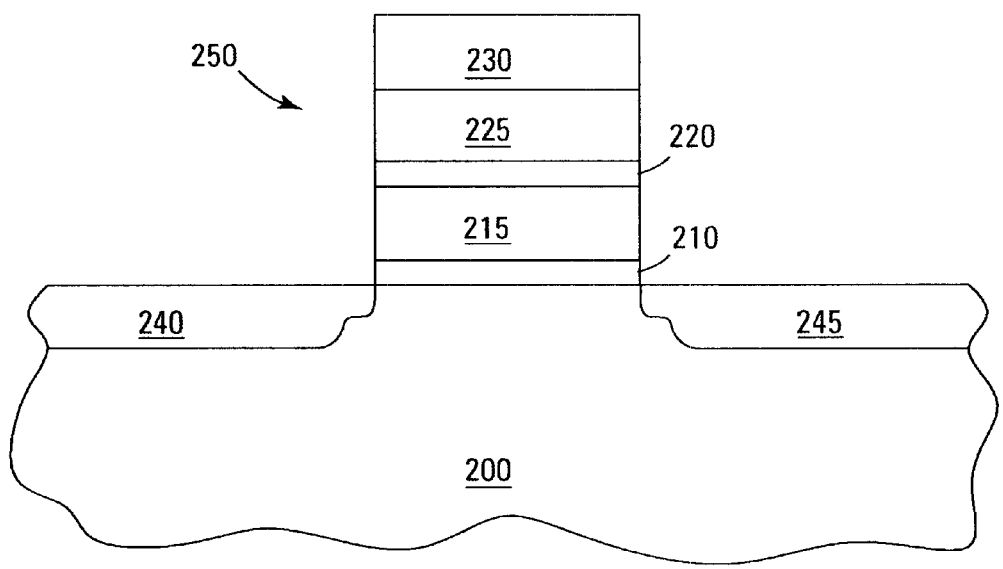

In FIG. 3B, the gate dielectric layer 210, the floating gate layer 215, the intergate dielectric layer 220, the control gate layer 225 and the cap layer 230 are then patterned to define the gate 250. At least the control gate layer 225 of the gate 250 is coupled to the word line. It is noted that additional layers may form the gate 250, such as barrier layers to inhibit diffusion between opposing layers or adhesion layers to promote adhesion between opposing layers.

A first source/drain region 240 and a second source/drain region 245 are formed adjacent to the gate 250 as conductive regions having a second conductivity type different than the conductivity type of the substrate 200. For one embodiment, the source/drain regions 240 and 245 have a conductivity type opposite that of the substrate 200. For a further embodiment, the source/drain regions 240 and 245 are n$^+$ regions formed by implantation and/or diffusion of n-type dopants, such as arsenic or phosphorus. Doping the second source/drain region 245 serves to increase the capacitance between the second source/drain region 245 and the substrate 200.

For a further embodiment, the first source/drain region 240 and the second source/drain region 245 have the same dopant level. Such an embodiment facilitates formation of both source/drain regions using a single mask and implantation process. For another embodiment, the second source/drain region 245 has a dopant level higher than a dopant level of the first source/drain region 240. A higher dopant level of the second source/drain region 245 will serve to further increase the capacitance between the second source/drain region 245 and the substrate 200. For yet another embodiment, the first source/drain region 240 has a more graded junction profile. This will reduce the bit-line junction capacitance but will no t imp act the efficiency of band-to-band tunneling in the channel for programming the cell.

The edges of the source/drain regions 240 and 245 are generally made to coincide with, or underlap, the gate edges. As an example, the source/drain regions 240 and 245 may be formed using angled implants or post-implant anneals to contact the channel region of the gate 250.

Figure 3C:
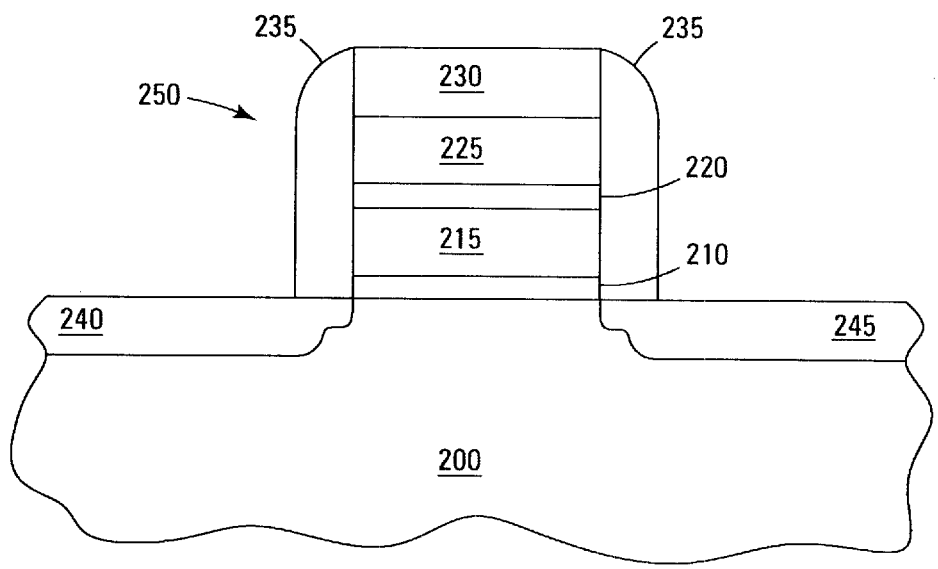

The sidewalls of the gate 250 are then insulated using sidewall spacers 235 as shown in FIG. 3C. The sidewall spacers 235 contain an insulator and may include the same materials as the cap layer 230. The sidewall spacers 235 are typically formed by blanket depositing an insulating layer, such as a layer of silicon nitride, over the entire structure and then anisotropically etching the insulating layer to preferentially remove the horizontal regions and to leave only the vertical regions adjacent the sidewalls of the gate 250. While FIG. 3C shows just one gate 250, a typical array of memory cells will include multiple word lines. For clarity, these additional word lines are not shown in FIG. 3C.

Figure 3D:
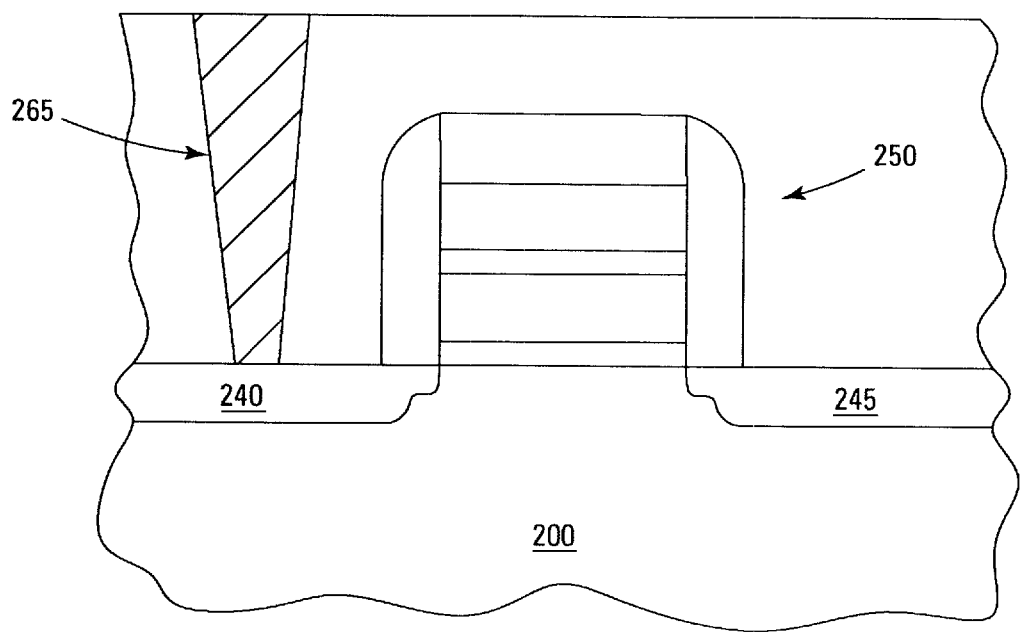

In FIG. 3D, a bit line contact 265 is formed to the first source/drain region 240 for coupling to a bit line (not shown in FIG. 3D). Note that no contact is formed to the second source/drain region 245 as there is no need to apply or detect a bias on the second source/drain region 245. Elimination of the contact to the second source/drain region simplifies the manufacturing process by eliminating formation of the contact itself as well as eliminating any metal or other conductive trace used to connect the contact to a bias.

Figure 4:
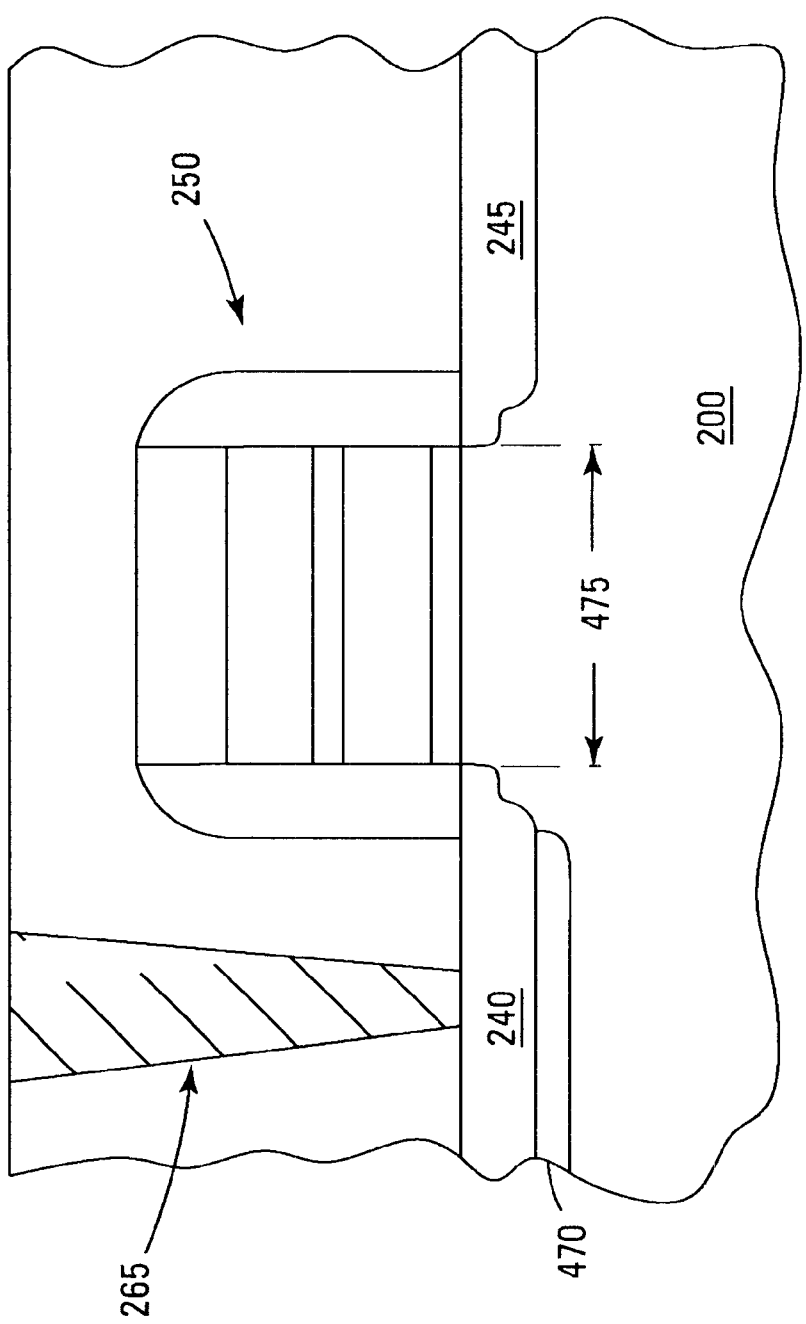
FIG. 4 is a cross-sectional view of a floating-gate memory cell in accordance with another embodiment of the invention.

FIG. 4 depicts a variation of the floating-gate memory cell of FIGS. 3A–3D. In FIG. 4, doped region 470 having the second conductivity type is formed beneath the first source/drain region 240. The doped region 470 has a dopant level less than the dopant level of the first source/drain region 240. Thus, for one embodiment, the doped region 470 is an n$^-$ region.

The doped region 470 is laterally offset from the channel region 475 of the floating-gate memory cells. For one embodiment, the doped region 470 is formed subsequent to formation of the sidewall spacers 235 in order to produce the lateral offset. The offset doped region 470 will reduce bit-line junction capacitance without detrimentally impacting the efficiency of band-to-band tunneling in the channel region 475 required for programming. Formation of the doped region 470 may include implantation of n-type dopants using a higher energy level and lower dosage than used to form the first source/drain region 240.

For another embodiment, the doped region 470 is formed using a different dopant species than the first source/drain region 240 to grade the junction. For example, a first source/drain region 240 may be formed using arsenic as the dopant species while the doped region 470 may be formed using phosphorus as the dopant species. In this example, phosphorus creates a more graded junction than arsenic alone. Increasing the grading of this junction will reduce the junction capacitance of the bit line which will facilitate bit line capacitance sensing schemes described below. Increasing the grading of the junction will additionally improve the breakdown voltage of the junction, thus allowing higher voltages to be applied to the first source/drain region 240.

Programming of floating-gate memory cells in accordance with the invention can be carried out via band-to-band-tunneling-induced substrate hot-electron injection. Using a p-channel memory cell as an example, a negative bias may be applied to the first source/drain region while a positive bias is applied to the control gate. In this manner, electron-hole pairs are generated by band-to-band tunneling in the first source/drain region and are accelerated by a lateral electric field toward the channel region and into the floating gate. See, e.g., "Novel Electron Injection Method Using Band-to-Band Tunneling Induced Hot Electron (BBHE) for Flash Memory with a P-channel Cell," T. Ohnakado. K. Mitsunaga, M. Nunoshita, H. Onoda, K. Sakakibara, N. Tsuji, N. Ajika, M. Hatanaka and H. Miyoshi, IEDM 95 pp. 279–282. Erase operations can be carried out using Fowler-Nordheim tunneling. For one embodiment, read operations are carried out using bit line capacitance sensing. For another embodiment, read operations are carried out using forward current sensing.

For bit line capacitance sensing, the read operation is performed with a control gate bias that is greater than the $V_t$ (threshold voltage) of a memory cell in a first programmed state, such as a logic 1 state, and less than the $V_t$ of a memory cell in a second programmed state, such as a logic 0 state. For an n-channel device, the first programmed state corresponds to a discharged floating gate layer while the second programmed state corresponds to a negatively-charged floating gate layer. Alternatively, for a p-channel device, the first programmed state corresponds to a negatively-charged floating gate layer while the second programmed state corresponds to a discharged floating gate layer. The control gate bias is applied to the control gate layer when the word line associated with the memory cell is selected.

In the first programmed state, an inversion layer is formed in the channel below the gate dielectric layer of the memory cell upon application of the control gate bias. The inversion layer can be thought of as an extension of the source/drain regions into the channel. Under this condition, the bit line capacitance is substantially equal to the sum of the bit-line junction capacitance at the first source/drain region, the bit line parasitic capacitance, the inversion-layer-to-gate capacitance, the inversion-layer-to-body capacitance, and the second source/drain region junction capacitance.

In the second programmed state, no inversion layer is formed in the channel below the gate dielectric layer of the memory cell upon application of the control gate bias, thus the inversion-layer-to-gate capacitance and the inversion-layer-to-body capacitance is effectively zero. Furthermore, under this condition, the bit line capacitance collapses to be substantially equal to the sum of the bit-line junction capacitance and the bit line parasitic capacitance as no inversion layer is available to provide coupling to the second source/drain region junction.

Reading a memory cell is thus carried out by differentiating between the bit line capacitance of the cell in the first programmed state and the bit line capacitance of the cell in the second programmed state. In principle, the sensing can be accomplished by first charging the target bit line to a first potential and a reference bit line to a second, lower potential with the control gate, i.e., the word line, of the target memory cell not selected. The reference bit line and the target bit line are then isolated. A reference bit line preferably has the same configuration as the target bit line. For example, the target bit line and the reference bit line are generally coupled to the same number of memory cells. The reference bit line is generally a bit line in the same memory array as the target bit line, although a dummy bit line can also be used. When used as a reference bit line, no memory cell coupled to the reference bit line is selected.

When the word line of the target memory cell is selected, a memory cell in the first programmed state will cause the target bit line potential to decrease in order to charge the added capacitance, i.e., the target bit line will lose charge to the target memory cell. A target memory cell in the second programmed state will create substantially no additional capacitance and thus will not produce a change in the bit line potential as the charge loss will be substantially zero. The first and second potentials are chosen such that a target memory cell in the first programmed state will pull the bit line to a potential lower than the second potential upon re-coupling the memory cell. Standard sensing techniques can then be used to detect the voltage differential between the target bit line and a reference bit line caused by the charge loss to the target memory cell.

It is noted that other techniques may be used for sensing a capacitance difference in accordance with the invention. As one example, the capacitance of the target memory cell may be charged, by selecting its word line and applying a bias from the bit line, followed by isolating the memory cell from the bit line. This charge bias should be selected such that it is sufficient to charge the capacitance of the memory cell in either programmed state without producing a breakdown of the device; higher charge levels will produce larger differentials between the target bit line and the reference bit line. The target bit line is then charged to a first potential and a reference bit line is charged to a second, higher potential. Upon re-coupling the target memory cell to the bit line, the amount of charge exiting the memory cell may be detected. The first potential, the second potential and the charge bias are chosen such that a target memory cell in the first programmed state will raise the bit line to a potential higher than the second potential upon re-coupling the memory cell. The relative potentials of the target bit line and reference bit line may then be sensed to indicate the data value of the target memory cell. Other capacitance sensing techniques may also be used.

Capacitance sensing of floating-gate memory cells of the type described herein facilitates relatively aggressive scaling of floating-gate memory cells. Aggressive scaling is desirable in light of the constant pressure to reduce device sizing. Capacitance sensing in accordance with the invention is effectively immune from MOSFET short channel effects, thus facilitating smaller device size without a need to accommodate such short channel effects.

To improve the sensing operation for capacitance sensing, it is desirable to decrease the bit-line junction capacitance. Techniques for decreasing this capacitance were provided above, such as forming a more graded doped region below the first source/drain region, offset from the channel region and having a conductivity type opposite that of the substrate. To improve the sensing operation, it is also desirable to increase the inversion-layer-to-body capacitance and the second source/drain region junction capacitance. Techniques for increasing these capacitances were also provided above, such as increasing the dopant level in the channel region and/or doping the second source/drain region to have a conductivity type opposite that of the substrate. The depth and position of the peak of dopant concentration in the second source/drain region can be adjusted to produce the desired $V_t$ while increasing capacitance.

To further increase the second source/drain region junction capacitance, the conductively-doped second source/drain regions of multiple memory cells may be coupled, provided that each of the coupled second source/drain regions are associated with memory cells coupled to the same bit line. As an example, a first column of memory cells in a block may have commonly-coupled, but electrically floating second source/drain regions; and a second column of memory cells in the block may have commonly-coupled, but electrically floating second source/drain regions; provided each of the second source/drain regions of the first column is electrically isolated from each of the second source/drain regions of the second column. In general, increasing the area of the inversion layer and/or second source/drain region will result in increasing capacitance values. For one embodiment, the second source/drain regions of a column of memory cells are commonly coupled by implanting high-energy dopant ions through field oxide regions surrounding the memory cells. For alternate embodiments, the second source/drain regions of a column of memory cells may be commonly coupled using other techniques, such as an epitaxial layer or a local interconnect.

Floating-gate memory cells of the type described herein may also be read using a forward current sensing technique. As with bit line capacitance sensing, the read operation is performed with a control gate bias that is greater than the $V_t$ of a memory cell in a first programmed state, such as a logic 1 state, and less than the $V_t$ of a memory cell in a second programmed state, such as a logic 0 state. For an n-channel device, the first programmed state corresponds to a discharged floating gate layer while the second programmed state corresponds to a negatively-charged floating gate layer. Alternatively, for a p-channel device, the first programmed state corresponds to a negatively-charged floating gate layer while the second programmed state corresponds to a discharged floating gate layer. The control gate bias is applied to the control gate layer when the word line associated with the memory cell is selected.

In forward current sensing, a small forward bias is applied to the bit line. For one embodiment, the forward bias is approximately 0.3–0.8V. Sensing between a memory cell in the first programmed state and the second programmed state is based on the resulting current difference between the two states.

Figure 5A:
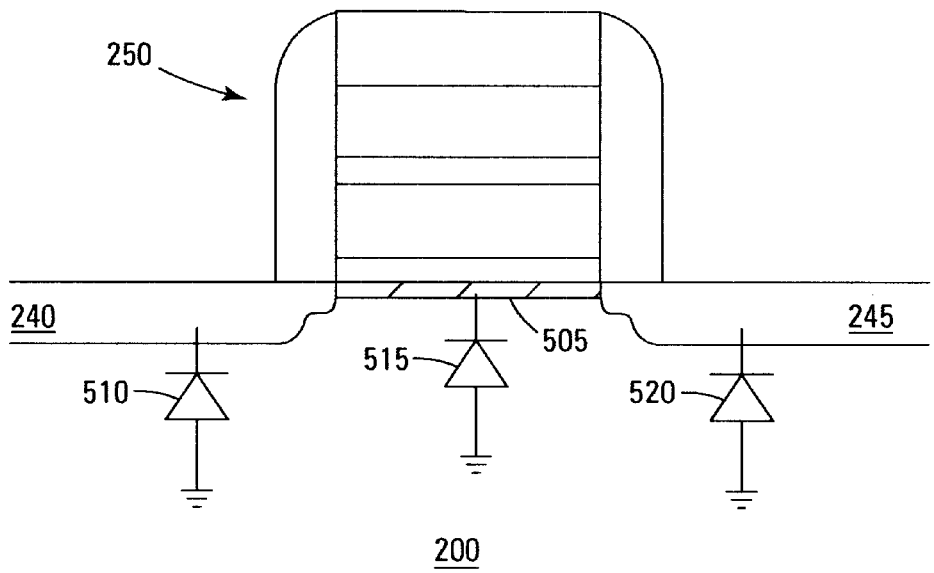
FIG. 5A is a representation of the p-n diode configuration for a memory cell in a first programmed state in accordance with an embodiment of the invention.

In the first programmed state, an inversion layer is formed in the channel below the gate dielectric layer of the memory cell upon application of the control gate bias. The inversion layer can be thought of as an extension of the source/drain regions into the channel. Under this condition, the forward bias of the bit line induces forward current flow through the p-n diodes as depicted in FIG. 5A. The first diode 510 is formed between the substrate 200 of the first conductivity type and the first source/drain region 240 of the second conductivity type. The second diode 515 is formed between the substrate 200 and the inversion layer 505. The third diode 520 is formed between the substrate 200 and the second source/drain region 245 of the second conductivity type.

Figure 5B:
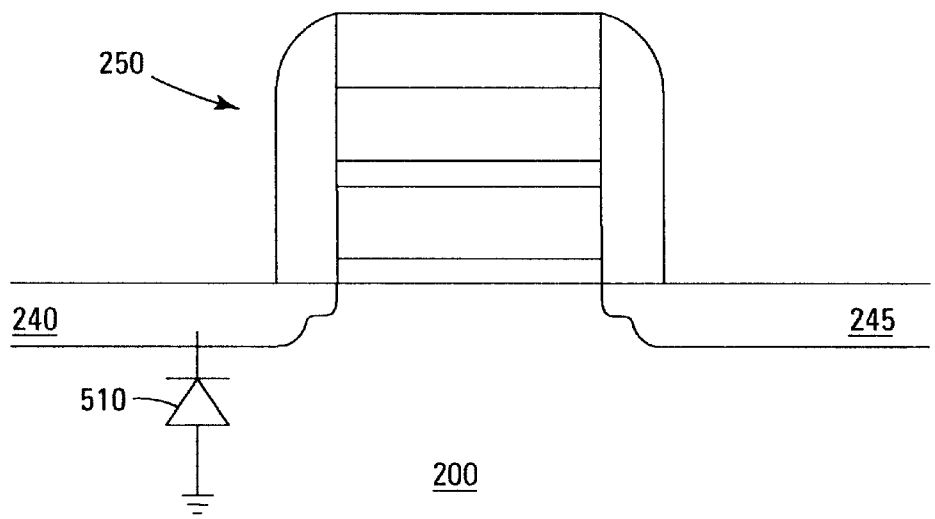
FIG. 5B is a representation of the p-n diode configuration for a memory cell in a second programmed state in accordance with an embodiment of the invention.

FIG. 5B depicts the p-n diode when the memory cell is in the second programmed state. In the second programmed state, no inversion layer is formed in the channel below the gate dielectric layer of the memory cell upon application of the control gate bias. Under this condition, the bit line is decoupled from the second source/drain region 245 and only the p-n diode 510 formed between the substrate 200 and the first source/drain region 240 is available for current flow.

The effective diode area available for bit-line forward current through a memory cell in a first programmed state is relatively larger than the effective diode area available for bit-line forward current through a memory cell in a second programmed state, thus producing a higher forward current through a memory cell in the first programmed state. Reading a memory cell is thus carried out by differentiating between the bit-line forward current through a cell in the first programmed state and the bit-line forward current through a cell in the second programmed state. In principle, the sensing can be accomplished by charging the target bit line to a first potential and charging a reference bit line to a second, lower, potential. The reference bit line and the target bit line are then isolated.

When the word line of the target memory cell is selected, a memory cell in the first programmed state will cause the target bit line potential to decrease at a first rate in response to the forward current to the substrate through the effective diode area of the memory cell. A target memory cell in the second programmed state will cause the target bit line potential to decrease at a second rate in response to the forward current through the effective diode area of the memory cell. As the effective diode area of the memory cell is lower in the second programmed state than the first programmed state, the second rate of potential decrease is less than the first rate of potential decrease. The target bit line is discharged through the target memory cell for a predetermined time. The first potential, second potential and predetermined time are selected such that a target memory cell in the first programmed state will pull the bit line to a potential lower than the second potential while a target memory cell in the second programmed state will maintain the bit line at a potential higher than the second potential. The relative potentials of the target bit line and reference bit line may then be sensed to indicate the data value of the target memory cell.

It is noted that other techniques may be used for sensing a current flow difference in accordance with the invention. As one example, the target bit line may be charged to a first potential and a reference bit line may be charged to a second, higher potential. A constant current source may be applied to the target bit line for a predetermined time with the memory cell selected.

The first potential, second potential, constant current source and predetermined time are selected such that the constant current source will pump the target bit line to a potential higher than the second potential when coupled to a target memory cell in the second programmed state while the constant current source is insufficient to pump the target bit line to a potential higher than the second potential when coupled to a target memory cell in the first programmed state. Thus, the target bit line will rise to a potential level higher than the second potential in the second programmed state, but remain at a potential level lower than the second potential in the first programmed state. With the memory cell in the first programmed state, it is recognized that the potential level of the target bit line may rise, albeit at a slower rate than with the memory cell in the second programmed state. Alternatively, the target bit line may remain at a constant potential or may fall below the first potential when the target memory cell is in the first programmed state. The relative potentials of the target bit line and reference bit line may then be sensed to indicate the data value of the target memory cell. Other current sensing techniques may also be used.

To improve the sensing operation, it is desirable to decrease the effective diode area of the bit-line junction. Techniques for decreasing this diode area include reducing the number of word lines, and thus first source/drain regions, associated with a bit line; all first source/drain regions coupled to a bit line contribute to the effective diode area of the bit-line junction regardless of whether a memory cell is programmed or even selected. To improve the sensing operation, it is also desirable to increase the effective diode area of the inversion layer and/or the second source/drain region. As a trivial example, the area of the inversion layer could be increased by enlarging the memory cell gate. However, this is generally at odds with the desire to reduce component and die sizes.

Effective diode area can also be increased by using a floating-gate memory cell of the type described herein having a conductively-doped second source/drain region. As a further improvement in diode area, the second source/drain regions of multiple memory cells may be coupled. For one embodiment, the second source/drain regions of each memory cell in the array or block are coupled as in conventional flash architecture, albeit electrically floating during the read operation. Alternatively, the second source/drain regions may be coupled as in a contiguous conductively-doped region spanning multiple memory cells, but without a source-line contact to this contiguous conductively-doped region. For forward current sensing of the various embodiments, second source/drain regions of cells on multiple bit lines may be coupled together.

Forward current sensing of floating-gate memory cells of the type described herein facilitates more aggressive scaling of floating-gate memory cells than conventional MOSFET current sensing. Aggressive scaling is desirable in light of the constant pressure to reduce device sizing. Forward current sensing in accordance with the invention is less sensitive to MOSFET short channel effects by eliminating the concern of source resistance inherent in MOSFET current sensing techniques.

CONCLUSION

Floating-gate memory cells have been described herein having a control gate for coupling to a word line, a floating gate, a first source/drain region for coupling to a bit line, and a floating second source/drain region. Such floating-gate memory cells eliminate the need to provide electrical contact to the second source/drain region, thus simplifying the fabrication process. Such memory cells further eliminate the need for a common source found in conventional floating-gate memory arrays.

Methods of reading such floating-gate memory cells are also provided. The methods described herein facilitate more aggressive scaling of the memory cells as they are less sensitive to MOSFET short channel effects than some conventional sensing techniques. Methods described herein include capacitance and forward current sensing techniques.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of reading a floating-gate memory cell, comprising:

applying a bias to a control gate of the floating-gate memory cell, wherein the bias is greater than a threshold voltage of the memory cell in a first programmed state and less than a threshold voltage of the memory cell in a second programmed state; and detecting a charge loss on a bit line coupled to a first source/drain region of the memory cell while a second source/drain region of the memory cell is electrically floating, wherein the charge loss is indicative of the programmed state of the memory cell.

2. The method of claim 1, wherein the charge loss on the bit line is at a first level if the memory cell is in the first programmed state and at a second level if the memory cell is in the second programmed state, and wherein the first level is greater than the second level.

3. The method of claim 2, wherein the second level is substantially zero.

4. The method of claim 1, wherein the method is performed in the order presented.

5. A method of reading a floating-gate memory cell formed in a substrate, the method comprising:

applying a bias to a control gate of the floating-gate memory cell, wherein the bias is greater than a threshold voltage of the memory cell in a first programmed state and less than a threshold voltage of the memory cell in a second programmed state;

applying a forward bias to a bit line coupled to a first source/drain region of the memory cell while a second source/drain region of the memory cell is electrically floating; and detecting a forward current from the memory cell to the substrate, wherein a level of the forward current is indicative of the programmed state of the memory cell.

6. The method of claim 5, wherein the forward current is at a first level if the memory cell is in the first programmed state and at a second level if the memory cell is in the second programmed state, and wherein the first level is greater than the second level.

7. The method of claim 5, wherein the method is performed in the order presented.

8. A method of reading a floating-gate memory cell, comprising:

charging a target bit line to a first potential, wherein the memory cell has a first source/drain region coupled to the target bit line;

charging a reference bit line to a second potential lower than the first potential;

isolating the charged bit lines;

applying a bias to a control gate of the memory cell subsequent to isolating the charged bit lines, wherein the bias is greater than a threshold voltage of the memory cell in a first programmed state and less than a threshold voltage of the memory cell in a second programmed state; and detecting a voltage differential between the target bit line and the reference bit line subsequent to applying the bias to the control gate and with a second source/drain region of the memory cell electrically floating.

9. The method of claim 8, wherein the second source/drain region is permanently electrically floating.

10. The method of claim 8, wherein the reference bit line is a bit line that is connected to one or more memory cells, wherein each memory cell connected to the reference bit line is not selected.

11. The method of claim 8, wherein the second source/drain region is commonly coupled to second source/drain regions of other floating-gate memory cells having their first source/drain regions coupled to the target bit line.

12. The method of claim 8, wherein no contact is formed to the second source/drain region.

13. The method of claim 8, wherein the method is performed in the order presented.

14. A method of reading a floating-gate memory cell, comprising:

applying a first bias to a control gate of the memory cell, wherein the first bias is greater than a threshold voltage of the memory cell in a first programmed state and less than a threshold voltage of the memory cell in a second programmed state;

applying a second bias to a first source/drain region of the memory cell through a target bit line associated with the memory cell while the first bias is applied to the control gate;

removing the first bias from the control gate;

charging the target bit line to a first potential subsequent to removing the first bias from the control gate;

charging a reference bit line to a second potential higher than the first potential;

isolating the charged bit lines;

applying a third bias to the control gate of the memory cell subsequent to isolating the charged bit lines, wherein the third bias is greater than a threshold voltage of the memory cell in a first programmed state and less than a threshold voltage of the memory cell in a second programmed state; and detecting a voltage differential between the target bit line and the reference bit line subsequent to applying the third bias to the control gate and with a second source/drain region of the memory cell electrically floating.

15. The method of claim 14, wherein the second source/drain region is permanently electrically floating.

16. The method of claim 14, wherein the reference bit line is a bit line that is connected to one or more memory cells, wherein each memory cell connected to the reference bit line is not selected.

17. The method of claim 14, wherein the second source/drain region is commonly coupled to second source/drain regions of other floating-gate memory cells having their first source/drain regions coupled to the target bit line.

18. The method of claim 14, wherein no contact is formed to the second source/drain region.

19. The method of claim 14, wherein the second bias is sufficient to charge a capacitance of the memory cell without breakdown.

20. The method of claim 14, wherein the first bias and the third bias are the same and wherein the second bias is sufficient to charge a capacitance of the memory cell in the first programmed state and the second programmed state.

21. The method of claim 14, wherein the method is performed in the order presented.

22. A method of reading a floating-gate memory cell, comprising:

applying a bias to a control gate of the floating-gate memory cell, wherein the bias is greater than a threshold voltage of the memory cell in a first programmed state and less than a threshold voltage of the memory cell in a second programmed state; and detecting a capacitance of the memory cell while the bias is applied to the control gate, wherein the capacitance of the memory cell has a first level when the memory cell is in the first programmed state and a second level when the memory cell is in the second programmed state, the second level being lower than the first level;

wherein the memory cell has a first source/drain region coupled to a bit line for detecting the capacitance; and wherein the memory cell has a second source/drain region electrically floating while detecting the capacitance.

23. A method of reading a floating-gate memory cell, the method comprising:

charging a target bit line to a first potential, wherein the memory cell has a first source/drain region coupled to the target bit line;

charging a reference bit line to a second potential lower than the first potential;

isolating the charged bit lines;

applying a bias to a control gate of the memory cell subsequent to isolating the charged bit lines, wherein the bias is greater than a threshold voltage of the memory cell in a first programmed state and less than a threshold voltage of the memory cell in a second programmed state;

discharging the target bit line through the memory cell for a predetermined time while the bias is applied to the control gate and with a second source/drain region of the memory cell electrically floating; and detecting a voltage differential between the target bit line and the reference bit line subsequent to the predetermined time.

24. The method of claim 23, wherein the target bit line discharges at a first rate if the memory cell is in the first programmed state and at a second rate if the memory cell is in the second programmed state, and wherein the first rate is greater than the second rate.

25. The method of claim 23, wherein the first potential, the second potential and the predetermined time are selected such that the memory cell in the first programmed state will pull the target bit line to a potential lower than the second potential while the memory cell in the second programmed state will maintain the target bit line at a potential higher than the second potential.

26. The method of claim 23, wherein the first potential is approximately 0.3–0.8V.

27. The method of claim 23, wherein the reference bit line is a bit line that is connected to one or more memory cells, wherein each memory cell connected to the reference bit line is not selected.

28. The method of claim 23, wherein the method is performed in the order presented.

29. A method of reading a floating-gate memory cell, the method comprising:

charging a target bit line to a first potential, wherein the memory cell has a first source/drain region coupled to the target bit line;

charging a reference bit line to a second potential higher than the first potential;

isolating the charged bit lines;

applying a bias to a control gate of the memory cell subsequent to isolating the charged bit lines, wherein the bias is greater than a threshold voltage of the memory cell in a first programmed state and less than a threshold voltage of the memory cell in a second programmed state;

applying a constant current source to the target bit line for a predetermined time while the bias is applied to the control gate and with a second source/drain region of the memory cell electrically floating; and detecting a voltage differential between the target bit line and the reference bit line subsequent to the predetermined time.

30. The method of claim 29, wherein the first potential, the second potential, the constant current source and the predetermined time are selected such that the target bit line will rise to a potential higher than the second potential when the memory cell is in the second programmed state and the target bit line will remain at a potential lower than the second potential when the memory cell is in the first programmed state.

31. The method of claim 30, wherein the first potential, the second potential, the constant current source and the predetermined time are selected such that the target bit line falls to a potential level lower than the first potential when the memory cell is in the first programmed state.

32. The method of claim 29, wherein the method is performed in the order presented.

33. A method of reading a floating-gate memory cell, comprising:

applying a bias to a control gate of the floating-gate memory cell; and detecting a charge loss on a bit line coupled to a first source/drain region of the memory cell while a second source/drain region of the memory cell is electrically floating, wherein the charge loss is indicative of the programmed state of the memory cell.

34. A method of reading a floating-gate memory cell formed in a substrate, the method comprising:

applying a bias to a control gate of the floating-gate memory cell;

applying a forward bias to a bit line coupled to a first source/drain region of the memory cell while a second source/drain region of the memory cell is electrically floating; and detecting a forward current from the memory cell to the substrate.

35. A method of reading a floating-gate memory cell, comprising:

charging a target bit line to a first potential, wherein the memory cell has a first source/drain region coupled to the target bit line and a second source/drain region that is permanently electrically floating;

charging a reference bit line to a second potential lower than the first potential;

isolating the charged bit lines;

applying a bias to a control gate of the memory cell subsequent to isolating the charged bit lines; and detecting a voltage differential between the target bit line and the reference bit line subsequent to applying the bias to the control gate.

36. A method of reading a floating-gate memory cell having a control gate, a first source/drain region and an electrically floating second source/drain region, the method comprising:

applying a first bias to the control gate of the memory cell;

applying a second bias to the first source/drain region of the memory cell through a target bit line associated with the first source/drain region while the first bias is applied to the control gate;

removing the first bias from the control gate;

charging the target bit line to a first potential subsequent to removing the first bias from the control gate;

charging a reference bit line to a second potential higher than the first potential;

isolating the charged bit lines;

applying a third bias to the control gate of the memory cell subsequent to isolating the charged bit lines; and detecting a voltage differential between the target bit line and the reference bit line subsequent to applying the third bias to the control gate.

37. A method of reading a floating-gate memory cell, comprising:

applying a bias to a control gate of the floating-gate memory cell; and detecting a capacitance of the memory cell while the bias is applied to the control gate, wherein the capacitance of the memory cell has a first level when the memory cell is in the first programmed state and a second level when the memory cell is in the second programmed state, the second level being lower than the first level;

wherein the memory cell has a first source/drain region coupled to a bit line for detecting the capacitance; and wherein the memory cell has a second source/drain region electrically floating while detecting the capacitance.

38. A method of reading a floating-gate memory cell having a control gate, a first source/drain region and an electrically floating second source/drain region, the method comprising:

charging a target bit line to a first potential, wherein the first source/drain region is coupled to the target bit line;

charging a reference bit line to a second potential lower than the first potential;

isolating the charged bit lines;

applying a bias to the control gate subsequent to isolating the charged bit lines;

discharging the target bit line through the memory cell for a predetermined time while the bias is applied to the control gate; and detecting a voltage differential between the target bit line and the reference bit line subsequent to the predetermined time.

39. A method of reading a floating-gate memory cell having a control gate, a first source/drain region and an electrically floating second source/drain region, the method comprising:

charging a target bit line to a first potential, wherein the first source/drain region is coupled to the target bit line;

charging a reference bit line to a second potential higher than the first potential;

isolating the charged bit lines;

applying a bias to a control gate of the memory cell subsequent to isolating the charged bit lines;

applying a constant current source to the target bit line for a predetermined time while the bias is applied to the control gate; and detecting a voltage differential between the target bit line and the reference bit line subsequent to the predetermined time.

\* \* \* \* \*